United States Patent
Tsai et al.

(10) Patent No.: US 6,292,114 B1
(45) Date of Patent: Sep. 18, 2001

(54) EFFICIENT MEMORY MAPPING OF A HUFFMAN CODED LIST SUITABLE FOR BIT-SERIAL DECODING

(75) Inventors: Ping-Sing Tsai, Gilbert; Tinku Acharya, Tempe, both of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/329,632

(22) Filed: Jun. 10, 1999

(51) Int. Cl.$^7$ ........................................... H03M 7/40
(52) U.S. Cl. ........................ 341/67; 341/65; 341/106
(58) Field of Search .................... 341/65, 67, 106

(56) References Cited

U.S. PATENT DOCUMENTS

| | | | |
|---|---|---|---|
| 5,696,507 | * | 12/1997 | Nam ........................................ 341/67 |
| 5,990,812 | * | 11/1999 | Bakhmutsky ........................... 341/67 |
| 6,188,797 | * | 2/2001 | Moledina et al. ..................... 382/246 |

* cited by examiner

Primary Examiner—Michael Tokar
Assistant Examiner—Anh Q. Tran
(74) Attorney, Agent, or Firm—Blakely, Sokoloff, Taylor & Zafman LLP

(57) ABSTRACT

What is disclosed is a method that consists of constructing a bit-serial decoding table for a list of variable length codewords without the use of a binary decoding tree, and decoding using the decoding table, in a bit serial fashion, a bitstream encoded using those variable length codewords.

19 Claims, 5 Drawing Sheets

BSD Table

| Address | Node_Number | Input Value | Output Next Node_Number/ [Codeword] (Field 0) | Termination Flag (Field 1) |
|---|---|---|---|---|
| 0 | 0 | 0 | 1 | 0 |
| 1 | 0 | 1 | 2 | 0 |
| 2 | 1 | 0 | [a] | 1 |
| 3 | 1 | 1 | [b] | 1 |
| 4 | 2 | 0 | 3 | 0 |
| 5 | 2 | 1 | 4 | 0 |
| 6 | 3 | 0 | [c] | 1 |
| 7 | 3 | 1 | [d] | 1 |
| 8 | 4 | 0 | [e] | 1 |
| 9 | 4 | 1 | 5 | 0 |
| 10 | 5 | 0 | [f] | 1 |
| 11 | 5 | 1 | 6 | 0 |
| 12 | 6 | 0 | [g] | 1 |
| 13 | 6 | 1 | [h] | 1 |

Fig. 3

EFFICIENT MEMORY MAPPING OF A HUFFMAN CODED LIST SUITABLE FOR BIT-SERIAL DECODING

BACKGROUND OF THE INVENTION

1. Field of the Invention

The invention relates generally to data compression. More specifically, the invention relates to data compression for image processing and other such applications.

2. Description of the Related Art

Image compression techniques can be classified as either "lossy" or "lossless". With lossless compression, the original image prior to compression can be exactly recovered when the compressed image is decompressed. Consequently, lossless techniques, whose compression ratios depend upon the entropy of an image, do not achieve high compression ratios and, since they preserve a high percentage of original image information, are computationally expensive. By contrast, lossy compression schemes provide only an approximation of the original image. Thus, with lossy compression, greater compression ratios can be achieved but with loss in image quality compared to lossless techniques. One such lossy technique referred to as "predictive coding" (also called Digital Pulse Code Modulation (DPCM) which is well-known in the art) predicts the value of a successive pixel (pixels are color components related by spatial row, column position) by linearly combining the properties of already processed neighboring pixels. An error pixel is defined as the difference between the original image pixel and the corresponding predicted pixel. The error pixel is first quantized and then binary encoded. Traditionally, the binary encoding involves either using a fixed-length code or variable-length code which encodes the quantized error pixel (value). Variable-length coding is used in image/motion compression techniques such as JPEG (Joint Photographic Experts Group), MPEG (Motion Pictures Experts Group) and H.261. In the variable-length encoding situation, quantized error values will have different lengths based upon the number of bits needed to represent the value in binary. Thus, often, both a run-length (i.e., the length of the code to follow or the number of consecutive zeroes or ones) and the code itself must be encoded. Strictly variable-length code is difficult to decode and inefficient to implement in a parallel processing architectures since there are no predefined boundaries between codewords. Variable-length encoding is inherently serial in nature, where decoding is usually done one bit at a time, since there is a wide possible variation in the lengths of the quantized error codes.

The implementation of such computationally intensive techniques demands more VLSI circuitry than is suitable for digital cameras and portable, small devices desiring image compression. One method developed for the decoding of variable length codes is the construction of a "decoding tree." Thus, in popular variable length coding schemes such as Huffman coding, after a Huffman encoding list (which specifies how and with what lengths data is to be coded) is developed, a corresponding decoding tree is also constructed and then somehow stored in memory. Starting from the root, the tree may be traversed through its branches until a leaf (terminal node) is encountered. The terminal node indicates that the codeword is fully decoded, such that the corresponding symbol may be read out. This process restarts at the root for each such potential codeword.

The construction of such decoding trees is resource intensive and can cost valuable time. Further, a key problem in the implementation of such methods is how to most efficiently store the decoding tree from which codewords may be decoded. Thus, there is a need for simpler technique to implement bit-serial decoding while reducing the complexity and resource use of that in traditional decoding tree techniques.

SUMMARY OF THE INVENTION

A method comprising constructing a bit-serial decoding table for a list of variable length codewords without the use of a binary decoding tree, and then decoding using that decoding table, in a bit serial fashion, a bitstream encoded using the variable length codewords.

BRIEF DESCRIPTION OF THE DRAWING

The objects, features and advantages of (e method and apparatus for the present invention will be apparent from the following description in which:

FIG. 3 shows an exemplary set of BSD table entries that may be constructed according to one embodiment of the invention.

DETAILED DESCRIPTION OF THE INVENTION

Referring to the figures, exemplary embodiments of the invention will now be described. The exemplary embodiments are provided to illustrate aspects of the invention and should not be construed as limiting the scope of the invention. The exemplary embodiments are primarily described with reference to block diagrams or flowcharts. As to the flowcharts, each block within the flowcharts represents both a method step and an apparatus element for performing the method step. Depending upon the implementation, the corresponding apparatus element may be configured in hardware, software, firmware or combinations thereof.

Variable length coding schema, such as Huffman coding, are often designed to provide a unique combination or bit sequence such that no code is the subset prefix of another code. Thus, Huffman encoded data may be serially decoded, but to do so, requires the construction of a decoding table.

The memory mapped table for bit serial decoding, labeled BSD, is a table that specifies by bits and nodes an addressing as well as decoding scheme that is specifically suited for a particular set of codewords. The BSD (Bit Serial Decoding) table is constructed from the Huffman codeword list without reference to any binary decoding tree. This avoids having to construct the tree and then having to store the tree in order to develop a decoding table. The methodology for directly constructing a decoding table without resorting to a binary decoding tree or similar mechanism, is outlined in FIG. 1.

Figure 1:
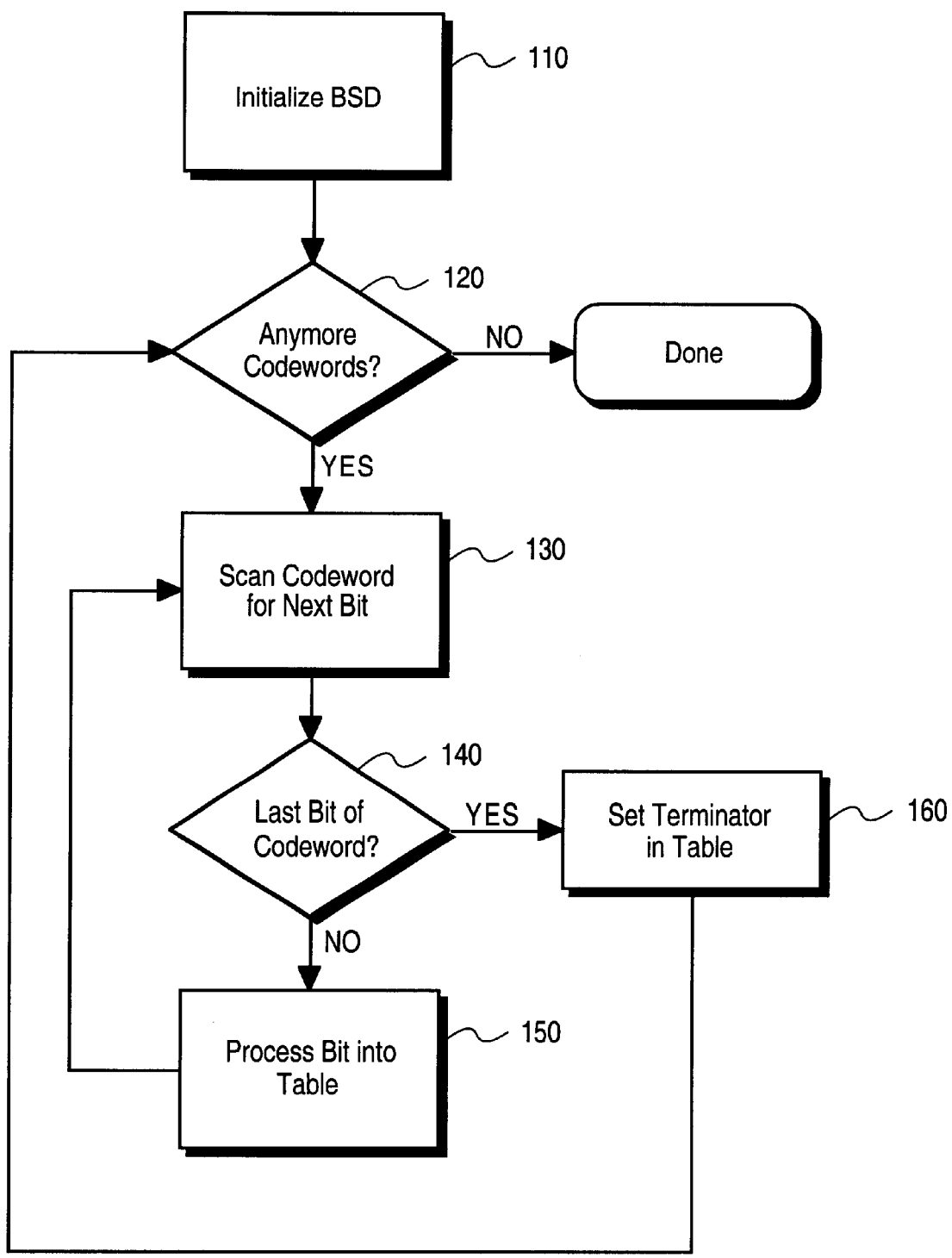
FIG. 1 is a flow diagram according to one embodiment of the invention.

FIG. 1 is a flow diagram according to one embodiment of the invention.

Firs, the BSD table is initialized (block 110). This involves setting a terminator flag for each address in the table where the ending bit of a codeword is reached. The BSD table contains, for each address, a terminator flag and a second field specifying a component (referred to as the "node number") for the next look-up address for the codeword or the symbol represented by the codeword. The procedure shown in blocks 130–160 repeats until there are no more codewords to process (checked at block 120).

In this procedure, each bit is scanned in every codeword in a sequential manner (block 130). Since most codes such are Huffman have prefix exclusivity, the sequence is most efficiently handled starting from the most significant bit to the least significant bit. As each bit is scanned, a check is performed to see if that bit is the last in the particular codeword being processed (checked at block 140). If it is not the last bit, then the bit is processed to form a new table entry having a zero termination flag (block 150). If the scanned bit is the last bit in the codeword, then the termination flag is set in the table (block 160) and the symbol is written to the table.

Figure 2:
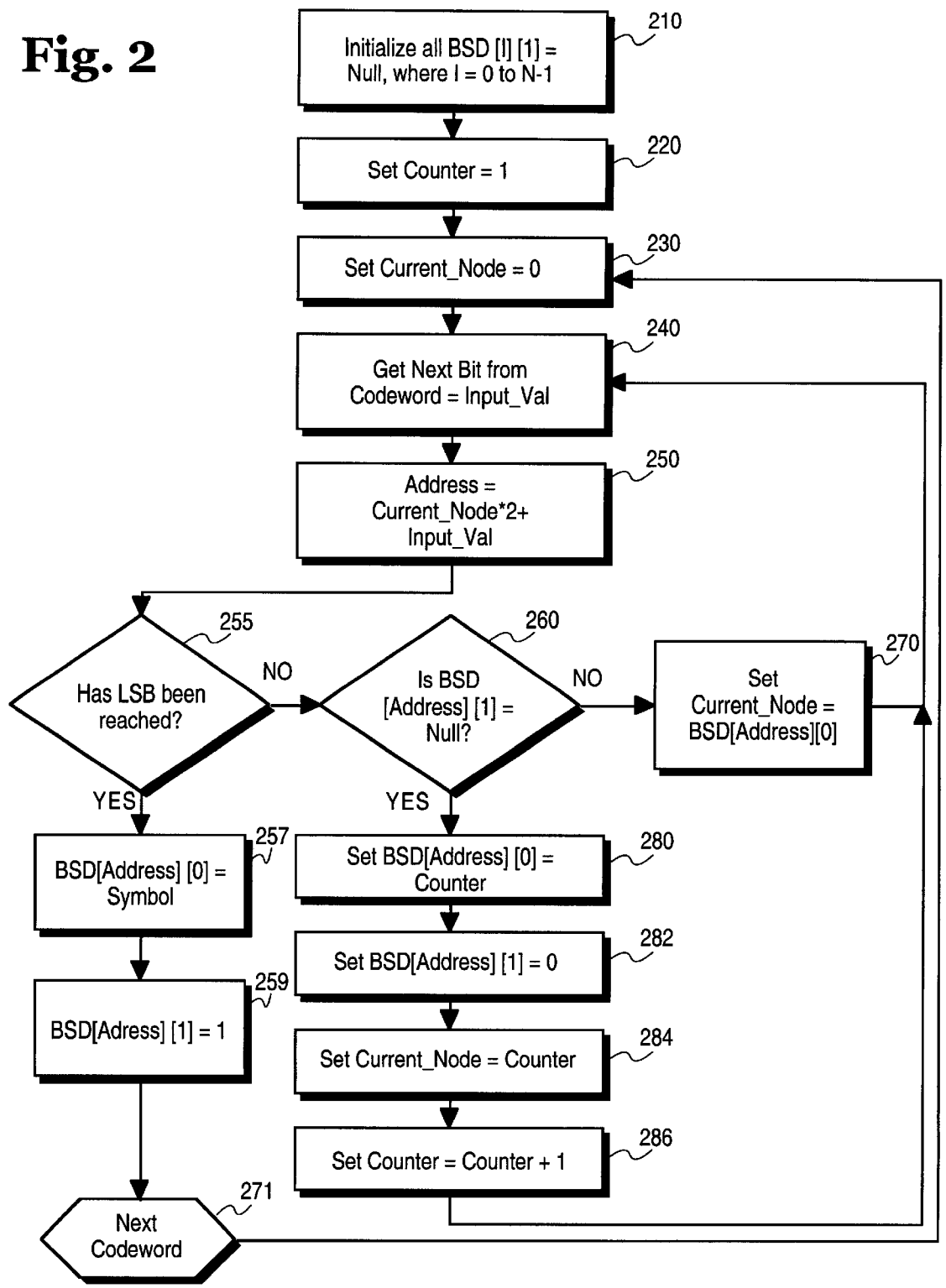
FIG. 2 is a flow diagram according to one embodiment of the invention.

FIG. 2 is a flow diagram according to one embodiment of the invention.

FIG. 2 describes one possible methodology for processing the bits in a particular codeword and roughly corresponds to a exemplary discussion of the operation of blocks 150 and 160 from FIG. 1.

The BSD table, which will store the decoding sequence and symbols from the variable codewords, would have dimensions of 2 by 2*N, where N is the number of symbols encoded. In one embodiment, the table will have two fields-a codeword/next node number field and a termination flag field-for each address. A termination flag value of zero indicates a non-termination while a value of one indicates that the codeword is completely resolved such that the corresponding symbol may be read out. FIG. 2 essentially describes a means to generate values for these fields in conjunction with an offset addressing scheme, where the input bit provides an offset value (either zero or one) to a base address. The BSD table will be represented in FIG. 2 by BSD[I] [J], where I represents the table address and ranges from 0 to 2*N−1, and where J represents the field being indexed (i.e., either the termination flag field (1) or the codeword/next node number field (0)) and ranges from 0 to 1.

First, according to block 210, all of the termination flag fields BSD[I][1] in the table are initialized to null (no value) since there is no a priori assignment of certain fields being termination fields or not. For each different variable codeword list, the termination flags may vary in distribution. A tracking variable "Counter" is initially set to 1 (block 220). A second variable, "Current_Node," that tracks which node number is currently being accessed, is set to zero (block 230). Node zero represents the starting point from which decoding for a codeword proceeds.

The codeword is scanned bit-by-bit in a serial fashion with each bit from the codeword becoming the value of the variable "Input_Val" (block 240). The table is indexed by computing the value Current_Node*2 +Input_Val and this is assigned to the variable "Address" (block 250). The codeword bits are processed into the table BSD until the least significant bit (LSB) of the codeword is read out. A check whether a particular bit is the LSB is performed at block 255.

If the LSB has been reached, then the symbol can be written out to the table. To accomplish this, the field BSD [Address][0] is filled with the symbol (or alternatively, an index to a symbol table) that the codeword represents (block 257). Also, the termination flag field BSD[Address][1] is set equal to one (block 259), indicating that the symbol can be read out of BSD[Address][0], and that no more bits comprise the codeword. In constructing the table, the next codeword/symbol may then be processed (block 271).

If the LSB has not been reached (checked at block 255), then there are still bits in the codeword that need to be processed. As will be detailed in the example below, more than one codeword may share the same sequence of two or more bits. Thus, it is possible that the processing of a previous codeword/symbol into the table already resulted in a value (the "next" node component of the address to which decoding should progress) being assigned to the field BSD [Address][1]. Thus, the unknown condition, whether BSD [Address][1] is null or not, is tested (block 260). If BSD [Address][1] is not null, then the Current_Node variable is set equal to the value of BSD[Address][0] (block 270). The next bit in the codeword is then fetched (block 240), with processing for the current bit essentially bypassed (i.e., no resulting table write) and a new Address is computed (block 250) using the new Current_Node value read out from the table.

If BSD[Address][1] is null (checked at block 260), then a value needs to be written in accordance with which next node is to be indicated therein. The variable "counter", which tracks the next node component throughout the processing and is not reset between codewords. Rather than compute the actual next node in a binary tree sense, which is completely avoided, the methodology presented herein allows the next node number to be sequentially assigned. The variable "Counter" is used for this function.

Accordingly, the field BSD[Address][0] is written with the value of "Counter" (block 280). Since the bit is not the LSB, there is no termination when the address is indexed during decode and hence, the field BSD[Address][1] is written with a zero value (block 282). This indicates that the value in the BSD[Address][0] is the next node component of the next address to be indexed in the table and should not be confused with a symbol encountered upon codeword termination. So that the next address can be computed, the Current_Node is set to equal to the counter value (i.e., the newly assigned next node component becomes the new current node component)(block 284). The Counter variable is then incremented for future use (block 286).

Processing flow proceeds from either block 286 or block 270 back to block 240. Thus, for each bit in a codeword, blocks 255 through 286 are repeated. When the codeword LSB has been reached, the next codeword may be read out from the Huffman list and processed (block 271). For each new codeword in the list, the processing is repeated with Current_Node reset to zero (i.e., the default starting location)(block 230). In the manner described above an entire bit-serial decoding table such as that shown in the example of FIG. 3 may be constructed.

FIG. 3 shows an exemplary set of BSD table entries that may be constructed according to one embodiment of the invention.

For example, consider the following Huffman variable length codeword and symbol list:

TABLE 1

| Symbol | Codeword |
|---|---|
| a | 00 |
| b | 01 |
| c | 100 |
| d | 101 |
| e | 110 |

TABLE 1-continued

| Symbol | Codeword |
|---|---|
| f | 1110 |
| g | 11110 |
| h | 11111 |

Table 1 above is an exemplary Huffman coded list for eight symbols "a" through "h". Huffman coding is variable length coding in that each codeword may have a different length. In the conventional methodology, a binary decoding tree would be created that maps out each code in binary tree with leaf nodes containing the symbols represented by the path (codeword). After such a decoding tree is created, it is typically traversed to create a decoding table. The conventional methodology must not only create the binary tree, but store it as well. In the present invention, the use of a binary tree is completely avoided. By applying the methodology described in FIG. 1 and FIG. 2, a decoding table may be obtained directly from a Huffman codeword list such as that shown in Table 1 above. Such a table is shown in FIG. 3. The stored table would include the address and the two fields labeled "output" which includes a Next Node_Number/Codeword field and a termination flag field.

Referring to Table 1 above, the symbol "a" is designated to have a codeword "00". To construct the decoding table to reflect this, referring to FIG. 2, the following would result:

Block 210: All BSD[I][1] set NULL
Block 220: Counter=1
Block 230: Current_Node=0
Block 240: Input_Val=0 (i.e., the most significant bit of "00")
Block 250: Address=0*2+0=0
Block 255: LSB not reached, proceed to block 260
Block 260: BSD[0][1] =NULL, proceed to block 280
Block 280: Set BSD[0][0] =1, indicating the next node
Block 282: Set BSD[0][1] =0, indicating no termination
Block 284: Set Current_Node=1
Block 286: Set Counter=Counter+1
Block 240: next Input_Val 0 (LSB of codeword "00")
Block 250: Address=1*2+0=2
Block 255: LSB reached, proceed to block 257
Block 257: BSD[2][0] ="a", symbol corresponding to codeword "00" in Table 1
Block 259: Set BSD[2][1] =1, indicating a termination.

In a like manner, each codeword in the list and its corresponding symbol can be processed in the BSD table. If the methodology described in FIG. 2 is employed, the BSD table of FIG. 3 results. Referring to FIG. 2, when each new codeword is processed, the Current_Node variable is reset to 0, while the Counter variable is not reset, but rather, continues with whatever value it held at the end of processing the previous codeword.

Figure 4:
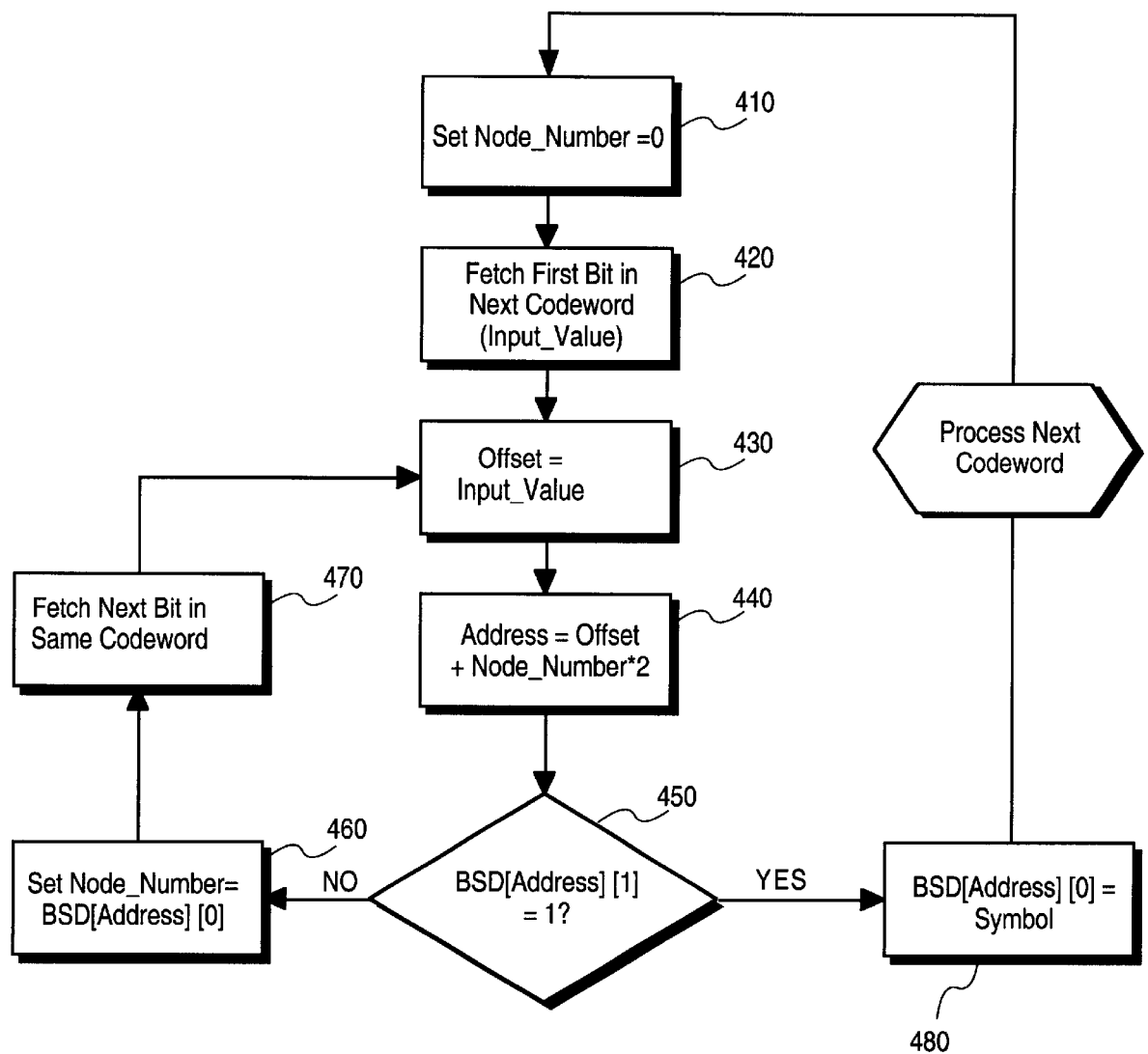
FIG. 4 is a flow diagram for decoding according to one embodiment of the invention.

When decoding a sequence of bits that represent one or more codewords, and thus symbols, the decoding is performed in a serial fashion with the BSD table being accessed during the decode. FIG. 4 describes the decode process, which is a series of table look-ups.

FIG. 4 is a flow diagram for decoding according to one embodiment of the invention.

When decoding a bitstream that is the result of Huffman coding a set of symbols, the Node_Number component of the BSD table indexing address is set to zero (block 410). Then, the first bit (most significant bit) in the codeword is fetched (block 420). The table is indexed using an offset mechanism, and accordingly, the offset component of the address is set equal to the input bit (1 or 0 in decimal) (block 430). The address is based upon a combination of the Node_Number component and the offset component. Specifically, the address for indexing is the offset plus twice the Node_Number component (block 440). This address is used to access the BSD table and get either the appropriate symbol or the value of the next Node_Number component for the next address to be computed. To determine whether the addressed table entries contain a symbol or the Node_Number component of the next table address, the termination flag field BSD[Address][1] is examined (block 450). If the termination flag is 1, then the field BSD[Address][0] is the symbol (since a termination flag of 1 indicates the ending bit of a codeword) (block 480), or alternatively an index to a symbol table. If the termination flag BSD[Address][1] is 0, then the codeword has more bits remaining to be decoded, and thus, the Node_Number component of the next computed table address resides in BSD[Address][0] rather than a symbol (block 460). Since there are more bits in the codeword in this case, the next bit of the same codeword is fetched (block 470). Processing continues with the newly fetched bit becoming the value of the offset component of the next table address (block 430). When the end of a codeword is reached (checked at block 450), that is when the termination flag BSD[Address][1] is 1, then the decoding process is reset with the Node_Number component being reset to zero (block 410).

To illustrate, consider the decoding of a Huffman bitstream "11100100". Assuming the Huffman list in Table 1 above was used to encode this bitstream and a decoding table BSD shown in FIG. 3, this stream may be decoded, using the methodology of FIG. 4, as follows:

Block 410: Node_Number=0
Block 420–440: Offset=Input Value "1"; Address=0*2+1=1
Block 450: Look up BSD[1][1]=0, so no termination
Block 460: Look up BSD[1][0]=2; new Node_Number=2
Block 470: Next Input Value=1
Block 430–440: Offset=Input Value=1; Address=2*2+1=5
Block 450: Look up BSD[5][1]=0, so no termination
Block 460: Look up BSD[5][0]=4; new Node_Number=4
Block 470: Next Input Value=1
Block 430–440: Offset=InputValue=1; Address=4*2+1=9
Block 450: Look up BSD[9] [1]0; so no termination
Block 480: Look up BSD[9][0]=5; new Node_Number=5
Block 430–440: Offset=InputValue=0; Address=5*2+0=10
Block 450: Look up BSD[10][1]=1; so codeword termination
Block 480: Look up BSD[10][0]="f"; decoded symbol=f
Block 410: Reset Node_Number =0;
Block 430–440: Offset=Input Value=0; Address=0*2+0=0
Block 450: Look up BSD[0][1]=0, so no termination
Block 460: Look up BSD[0][0]=1; new Node_Number=1
Block 470: Next Input Value=1

Block 430–440: Offset=Input Value=1; Address=1*2+1=3

Block 450: Look up BSD[3][1]=1; codeword termination

Block 480: Look up BSD[3][0]="b"; decoded symbol=b

Block 410: Reset Node Number=0

Block 420: Next Input Value=0

Block 430–440: Offset=Input Value=0, Address=0*2+0=0

Block 450: Look up BSD[0][1]=0, so no termination

Block 460: Look up BSD[0][0]=1; new Node_Number=1

Block 470: Next Input Value=0

Block 430–440: Offset=Input Value=0; Address=1*2+0=2

Block 450: Look up BSD[2][1]=1; codeword termination

Block 480: Look up BSD[2][0]="a"; decoded symbol=a

Thus, the bitstream "11100100" is decode as the sequence of symbols "fba". Referring back to the Huffman list, one can verify that 1110 is "f", 01 is "b" and 00 is "a", showing that the decoding table and the methodology of FIG. 4 give accurate results.

Figure 5:
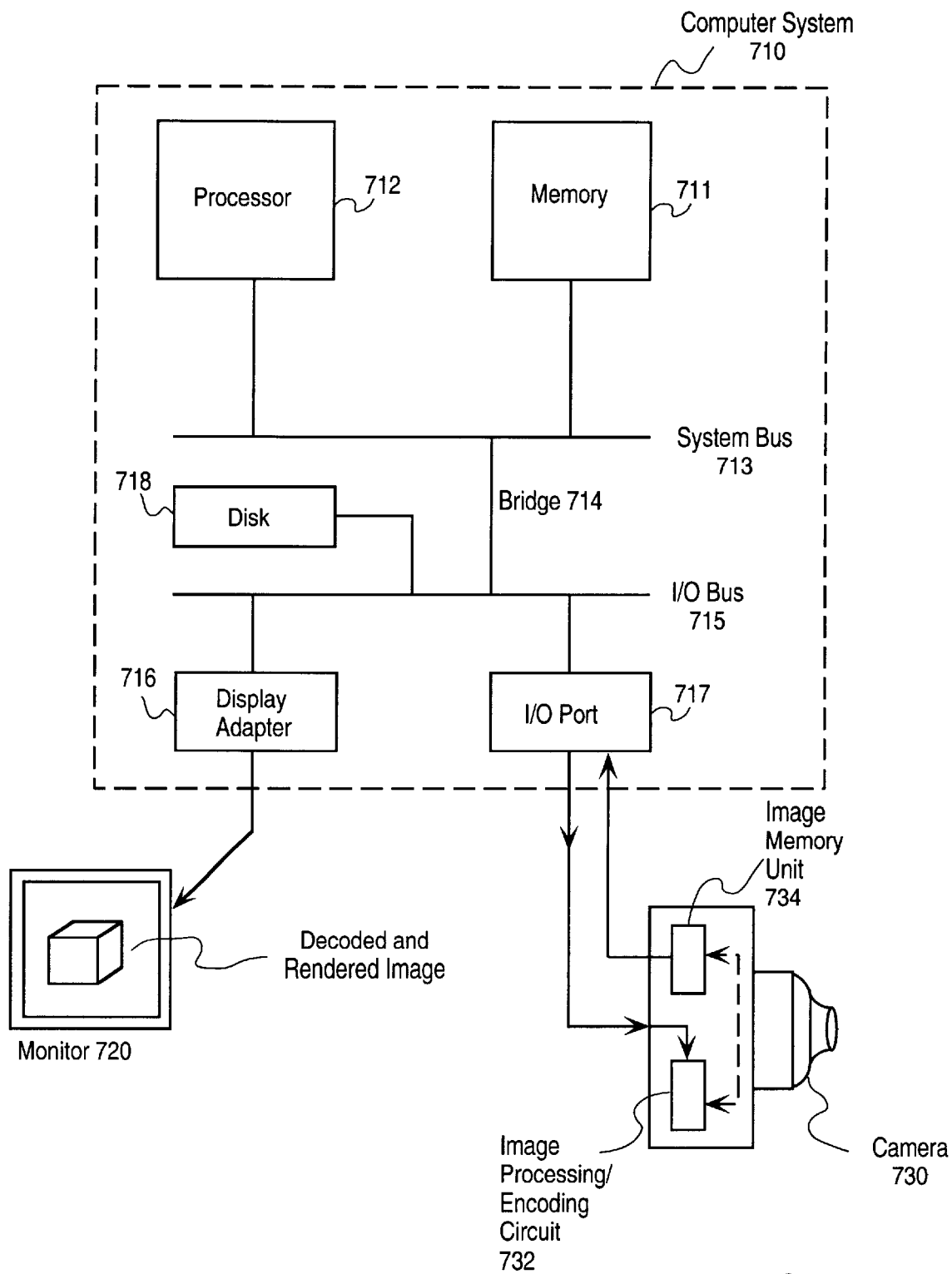
FIG. 5 is a system diagram of one embodiment of the invention.

FIG. 5 is a system diagram of one embodiment of the invention.

Illustrated is a computer system 710, which may be any general or special purpose computing or data processing machine such as a PC (personal computer), coupled to a camera 730. Camera 730 may be a digital camera, digital video camera, or any image capture device or imaging system, or combination thereof and is utilized to capture an image of a scene 740. Essentially, captured images are processed by an image processing circuit 732 so that they can be efficiently stored in an image memory unit 734, which may be a RAM or other storage device such as a fixed disk. The image contained within image memory unit 734 that is destined for computer system 710 may be compressed through use of a variable length code such as Huffman coding. In most digital cameras that can perform still imaging, images are stored first in such a compressed form and downloaded later. This allows the camera 730 to capture the next object/scene quickly without additional delay.

The image processing circuit 732 carries out image compression and including variable length or Huffman encoding. When a compressed and encoded image is downloaded to computer system 710, it may be decoded and then rendered to some output device such as a printer (not shown) or to a monitor device 720. Decoding of image data may be achieved using a processor 712 such as the Pentium™ processor (a product of Intel Corporation) and a memory 711, such as RAM, which is used to store/load instruction addresses and result data.

In one embodiment, the decoding table may be generated directly from the original Huffman list using a software application running on computer system 710. The application(s) used to perform the decoding table generation and/or actual decoding after download from camera 730 may be from an executable compiled from source code written in a language such as C++. The instructions of that executable file, which correspond with instructions necessary to decode the image, may be stored to a disk 718 or memory 711. Disk 718 or memory 711 may also store the decoding table once generated. Further, such application software may be distributed on a network or a computer-readable medium for use with other systems. In another embodiment, the decoding table can also be generated directly in the firmware with a relatively small code size.

When the user or application desires/requests a download of images, the encoded image data in the image memory unit, are transferred from image memory unit 734 to the I/O port 717. I/O port 717 uses the bus-bridge hierarchy shown (I/O bus 715 to bridge 714 to system bus 713) to temporarily store the data into memory 711 or, optionally, disk 718. Computer system 710 has a system bus 713 which facilitates information transfer to/from the processor 712 and memory 711 and a bridge 714 which couples to an I/O bus 715. I/O bus 715 connects various I/O devices such as a display adapter 716, disk 718 and an I/O port 717, such as a serial port. Many such combinations of I/O devices, buses and bridges can be utilized with the invention and the combination shown is merely illustrative of one such possible combination. The encoded image data may be decoded using the methodology of FIG. 4 and the decoding table and then rendered onto monitor 720. The elimination of a decoding tree for the purpose of decoding the image increases the speed and efficiency of the decoding process.

The exemplary embodiments described herein are provided merely to illustrate the principles of the invention and should not be construed as limiting the scope of the invention. Rather, the principles of the invention may be applied to a wide range of systems to achieve the advantages described herein and to achieve other advantages or to satisfy other objectives as well.

What is claimed is:

1. A method comprising:

constructing a bit-serial decoding table for a list of variable length codewords without the use of a binary decoding tree; and decoding using said decoding table, in a bit serial fashion, a bitstream encoded using said variable length codewords.

2. A method according to claim 1 wherein said constructing comprises:

fetching a codeword composed of a plurality of bits for each symbol in said Huffman list;

scanning one of said bits for said codeword; and processing said bit into said table.

3. A method according to claim 2 wherein scanning and processing repeat until the last bit of the codeword is scanned.

4. A method according to claim 3 wherein if the last bit of the codeword is reached, a terminator is set in said table.

5. A method according to claim 2 wherein fetching, scanning and processing are repeated for every codeword in the Huffman list.

6. A method according to claim 2 wherein constructing includes:

initializing, prior to any constructing, said table as an array of entries, each entry indexed by an address, each entry having two fields—a termination flag field and a next node_number/symbol field, said table having twice the number of entries as the number of codewords in said Huffman list; and setting a global counter equal to one prior to said constructing.

7. A method according to claim 2 wherein said processing includes the generating of said indexing address.

8. A method according to claim 7 wherein said address is generated as the sum of twice a current node_number and the value of said scanned bit.

9. A method according to claim 8 wherein said current node_number is set to zero when each new codeword is fetched.

10. A method according to claim 9 wherein if the least significant bit of said codeword has been scanned then setting the next node_number/symbol field of the entry indexed by said generated address equal to the symbol corresponding to that codeword from said Huffman list; and setting the termination flag field of the entry indexed by said generated address to one indicating that the next node_number/symbol field contains a decoded symbol.

11. A method according to claim 9 wherein if the least significant bit of the codeword has not been reached, then if termination flag field of the entry indexed by said generated address is null:

setting the next node_number/symbol of the entry indexed by said generated address equal to said counter value;

setting the termination flag field of the entry indexed by said generated address equal to zero;

setting said current node_number equal to said counter;

incrementing said counter by one; and scanning next bit of said codeword.

12. A method according to claim 9 wherein if the least significant bit of the codeword has not been reached, then if termination flag field of the entry indexed by said generated address is not null:

setting said current node_number equal to the value of the next node_number/symbol field of the entry indexed by said generated address; and scanning next bit of said codeword.

13. A method according to claim 1 wherein decoding includes:

setting a node_number variable equal to zero; and fetching the first bit of said codeword.

14. A method according to claim 13 wherein decoding includes:

generating an indexing address equal to the sum of twice said node_number and the value of said fetched bit.

15. A method according to claim 14 wherein if the termination flag field of the entry indexed by said generated address is equal to one, then reading out the next node_number/symbol field of the entry indexed by said generated address as the decoded symbol.

16. A method according to claim 14 wherein if the termination flag field of the entry indexed by said generated address is not equal to one, then setting the node_number equal to the next node_number/symbol field of the entry indexed by said generated address;

fetching the next bit in the bitstream; and repeating the generation of said indexing address.

17. An article comprising a computer readable medium having instructions stored thereon which when executed causes:

constructing a bit-serial decoding table for a list of variable length codewords without the use of a binary decoding tree.

18. A system comprising:

a processor, said processor configured to serially decode variable length codeword encoded data; and a memory coupled to said processor, said memory configured to store instructions and data relating to said decode, said decode performed using a stored table, said table constructed without use of a binary decoding tree.

19. An apparatus comprising firmware adapted to construct a bit-serial decoding table for a list of variable length codewords without the use of a binary decoding tree.

* * * * *